(12) United States Patent
Gallia et al.

(10) Patent No.: US 7,638,412 B2
(45) Date of Patent: Dec. 29, 2009

(54) METHOD AND SYSTEM FOR REDUCING CHARGE DAMAGE IN SILICON-ON-INSULATOR TECHNOLOGY

(75) Inventors: James D. Gallia, McKinney, TX (US); Srikanth Krishnan, Richardson, TX (US); Anand T. Krishnan, Farmers Branch, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/782,523

(22) Filed: Jul. 24, 2007

(65) Prior Publication Data
US 2007/0264804 A1 Nov. 15, 2007

Related U.S. Application Data

(62) Division of application No. 10/035,606, filed on Dec. 28, 2001, now Pat. No. 7,262,468.

(51) Int. Cl.
*H01L 21/20* (2006.01)
*H01L 21/36* (2006.01)
*H01L 21/302* (2006.01)
*H01L 21/461* (2006.01)

(52) U.S. Cl. .................. 438/479; 438/689; 438/707; 438/710; 257/E21.352

(58) Field of Classification Search ............... 438/63, 438/281, 479, 480, 516, 689, 707, 710; 257/E21.176, 257/E21.352
See application file for complete search history.

(56) References Cited

U.S. PATENT DOCUMENTS

| 5,610,790 | A | 3/1997 | Staab et al. |
| 5,892,260 | A | 4/1999 | Okumura et al. |
| 5,959,309 | A | 9/1999 | Tsui et al. |
| 5,994,742 | A | 11/1999 | Krishnan et al. |
| 6,054,740 | A | 4/2000 | Barret |
| 6,309,972 | B1 | 10/2001 | Pio |
| 6,521,515 | B1 | 2/2003 | Kluth |
| 2002/0109153 | A1 | 8/2002 | Ker et al. |

FOREIGN PATENT DOCUMENTS

EP 0 928 054 A2 7/1999

*Primary Examiner*—Shouxiang Hu
(74) *Attorney, Agent, or Firm*—Warren L. Franz; Wade J. Brady, III; Frederick J. Telecky, Jr.

(57) ABSTRACT

According to one embodiment of the invention, a silicon-on-insulator device includes an insulative layer formed overlying a substrate and a source and drain region formed overlying the insulative layer. The source region and the drain region comprise a material having a first conductivity type. A body region is disposed between the source region and the drain region and overlying the insulative layer. The body region comprises a material having a second conductivity type. A gate insulative layer overlies the body region. This device also includes a gate region overlying the gate insulative layer. The device also includes a diode circuit conductively coupled to the source region and a conductive connection coupling the gate region to the diode circuit.

13 Claims, 3 Drawing Sheets

METHOD AND SYSTEM FOR REDUCING CHARGE DAMAGE IN SILICON-ON-INSULATOR TECHNOLOGY

This application is a divisional of application Ser. No. 10/035,606, filed Dec. 28, 2001, now U.S. Pat. No. 7,262,468, issued Aug. 28, 2007.

TECHNICAL FIELD OF THE INVENTION

This invention relates generally to semiconductor manufacturing and more particularly to a method and system for reducing charging damage in silicon-on-insulator technology.

BACKGROUND OF THE INVENTION

Antenna charging is a phenomenon where a conducting electrode, referred to as an antenna, is exposed to charged particles. This may occur during plasma etching or plasma deposition, for example. Exposure to charged particles could cause a charge to be collected on the antenna. The antenna may comprise one or more metallization or silicon layers formed overlying a gate of a semiconductor transistor. If the antenna is connected to an active device, such as the above-described gate, the charging of the antenna could create a potential difference across the gate oxide, for example, which may induce current flow or arcing through the gate oxide. Such arcing or current flow could destroy the gate oxide, which is detrimental to the performance of the associated transistor device.

Silicon-on-insulator technology refers to forming semiconductor devices formed on a substrate of oxide, as opposed to a substrate of silicon. The above-described antenna charging phenomena was believed for some time to not affect silicon-on-insulator technology because the silicon islands below the gate oxide are small. Because of this, any charge that may collect on the antenna would quickly settle into this small silicon region, and thus not allow any significant potential difference to arise across the gate oxide. This contrasts with a conventional device formed on a layer of silicon in which a potential difference could develop across the gate oxide, since charge could flow into the silicon substrate. Recently, investigators have recognized that differential charging in which potential charges develop between more than one "antenna" can lead to a potential difference across a portion of a semiconductor device, for example the gate oxide of a silicon-on-insulator device. These antennas refer to antennas that would be connected to the various active portions of the transistor (gate, source, drain). Thus the problem of antenna charging remains in silicon-on-insulator devices.

Techniques used in non-silicon-on-insulator devices to address this problem have involved electrically connecting the charging electrode to the silicon substrate of the semiconductor device through a diode. This allowed the charge developed on the antenna to dissipate to the substrate of the semiconductor device. However, this approach is not applicable to silicon on insulator devices because there is no path to a silicon substrate, due to the oxide layer overlying the substrate.

SUMMARY OF THE INVENTION

According to one embodiment of the invention, a silicon-on-insulator device includes an insulative layer formed overlying a substrate and a source and drain region formed overlying the insulative layer. The source region and the drain region comprise a material having a first conductivity type. A body region is disposed between the source region and the drain region and overlying the insulative layer. The body region comprises a material having a second conductivity type. A gate insulative layer overlies the body region. This device also includes a gate region overlying the gate insulative layer. The device also includes a diode circuit conductively coupled to the source region and a conductive connection coupling the gate region to the diode circuit.

Embodiments of the invention provide numerous technical advantages. Some embodiments of the invention may benefit from some, none, or all of these advantages. For example, according to one embodiment of the invention, a method and system are provided that reduce the likelihood of current flow through the gate oxide of a semiconductor device by preventing or reducing charge buildup in metallization layers of the device. In one embodiment, this charge reduction may be reduced by conductively coupling the metallization layer to the source of the transistor of a silicon on insulator device. Such conductive coupling prevents the buildup of a potential difference between the source and the metal layer, and therefore reduces the likelihood of any current flow through the gate oxide. Preventing current flow through the gate oxide increases the reliability of the associated device.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

Embodiments of the present invention and its advantages are best understood by referring to FIGS. 1A through 3B of the drawings, like numerals being used for like and corresponding parts of the various drawings.

Figure 1A:
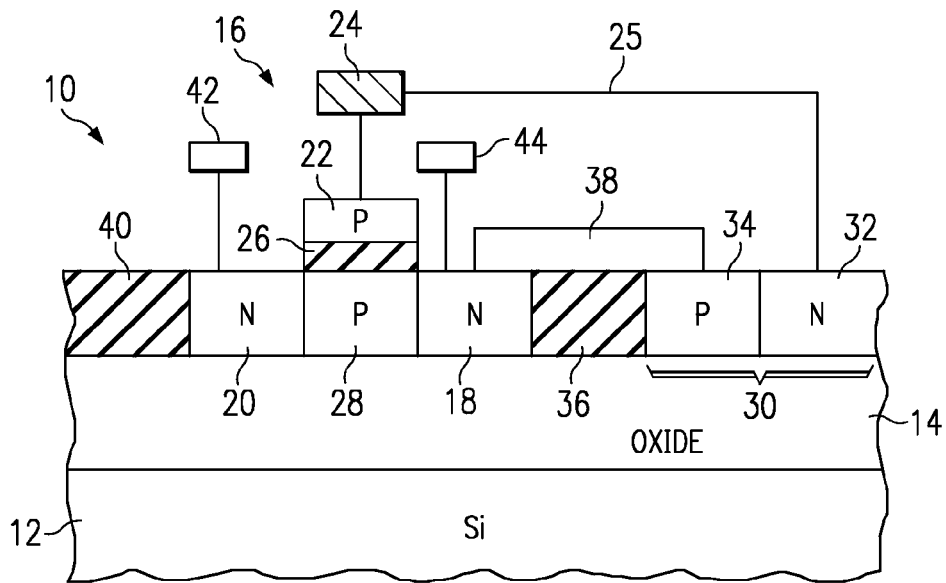
FIG. 1A is a partial cross-sectional and partial schematic diagram of portions of a semiconductor device according to the teachings of the invention.

FIG. 1A is a partial cross-sectional and partial schematic diagram of a semiconductor device 10 according to the teachings of the invention. In this example, semiconductor device 10 is a silicon-on-insulator (SOI) device. Semiconductor device 10 includes a substrate 12, an oxide layer 14 on which the active components of the device are formed, and a remaining portion 16 comprising the components formed on oxide layer 14. Remaining portion 16 includes a source region 18, a drain region 20, and a gate region 22 forming a field effect transistor. Represented in FIG. 1A in schematic form is a metallization layer 24 associated with gate 22. In this example, source 18 and drain 20 are formed of an n-type material, such as silicon doped with an n-type material, and body 28 is formed from a p-type material, such as silicon doped with a p-type material, thus creating an NPN transistor; however, PNP transistors may also benefit from the teachings of the invention. Metallization layer 24 represents a conductive contact to gate 22 and may include one or more layers of metallization or other conductive material, such as a doped polysilicon.

As described above, a problem afflicting semiconductor devices is charging of antennae, such as metallization layer 24, during fabrication, such as during plasma etching. To address this concern in SOI devices, such as device 10, according to the teachings of the invention metallization layer 24 is conductively coupled to source region 18 to allow any charge built up on metallization layer 24 to flow to source region 18 and thereby to silicon portion 28 underlying gate oxide 26. In doing so, any potential difference between across gate oxide 26 is eliminated. Also according to the teachings of the invention, the conductive coupling of metallization layer 24 to source region 18 is made through a diode 30.

Diode 30 comprises an n-type material 32 and a p-type material 34, in the example of FIG. 1A. By forming a conductive coupling between metallization layer 24 and source region 18 through a diode 30, no current is allowed to flow from source 18 to metallization layer 24 during operation of semiconductor device 10; however, during fabrication, such as plasma etching or plasma deposition, diode 30 is exposed to illumination, which allows leakage current to flow through the diode. In this case, diode 30 simply acts as a conductive connection between metallization layer 24 and source region 18. This is desirable because the conductive coupling of metallization layer 24 to source 18 allows current to flow in both directions, thus dissipating charge buildup of either polarity.

As illustrated, p-type silicon portion 34 of diode 32 is separated from source region 18 by an oxide region 36 to avoid the introduction of another p-n junction in device 10. Therefore, p-type silicon portion 34 is connected to source 18 through a conductive connection 38. In one embodiment, conductive connection 38 is simply a metal trace; however, any suitable conductive connection may be utilized. An oxide region 40 isolates semiconductor device 10 from other devices that may be formed on the same chip. Also illustrated in FIG. 1A is a metallization layer 42 associated with drain region 20 and a metallization layer 44 associated with source region 18. As described above, such metallization layers may act as antennae for collecting charge, particularly during plasma etching or deposition. Differential charging between metallization layer 24 and metallization layers 42 and 44 may cause current to flow through gate oxide 26. This is undesirable because it can cause defects in gate oxide 26. According to the teachings of the invention, such differential charging is reduced by conductive coupling of metallization layer 24 to source region 18 through one or more diodes.

Figure 1B:
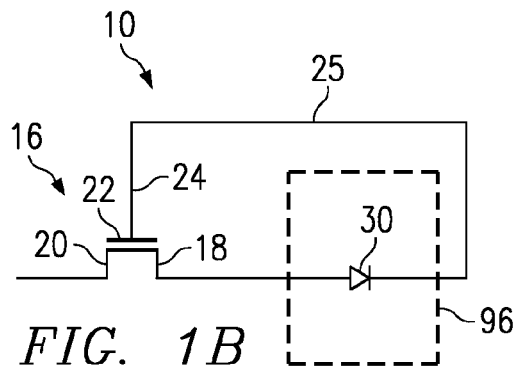
FIG. 1B is a circuit schematic representing the semiconductor device of FIG. 1A.

FIG. 1B is a schematic circuit diagram of salient portions of semiconductor device 10. As illustrated, the resulting circuit is a transistor 16 having its gate 22 connected through a conductive connection 25 and a diode circuit 96 to its source 18. Diode circuit 96 comprises diode 30. In this embodiment, diode 30 is operated in a reverse bias mode. Diode 30 is in reverse bias mode so that it does not turn on during normal operation. However, leakage flow is turned on during fabrication due to plasma illumination allowing leakage flow through the diode, even though it is in a reversed biased orientation. When in use, diode 30 prevents any charge from flowing from gate 22 or associated metallization layer 24 to source 18. However, during fabrication, diode 30 is exposed to illumination, thereby turning on leakage flow through the diode and allowing current to flow in both directions through diode 30. Such current flow is desirable because it allows charge accumulated on metallization layer 24 to dissipate to source 18, regardless on the polarity of the charge and therefore prevents any charge buildup that would produce an arc or current flow through gate oxide 26, thereby damaging transistor 16.

The embodiment of the invention illustrated in FIGS. 1A and 1B is particularly desirable in many instances. However, in some instances in which a differential voltage between source 18 and gate 22 is applied during operation that would allow current to flow from source 18 to gate 22 through diode 30, undesired current flow may arise through this configuration. This may happen if a voltage is applied to gate 22 that is low and source 18 is set to high. Examples in which this may occur are dynamic logic circuits, pass gate circuits, and MUX circuits. The embodiments of the invention described with respect to FIGS. 2 through 4 address this problem.

Formation of the semiconductor device 10 and transistor 16 may occur according to any suitable conventional or yet to be developed techniques. Conductive connection 25 may be formed according to conventional techniques, or yet to be developed techniques. One example for forming conductive connection 25 is forming a metal trace according to conventional semiconductor manufacturing processes conductively coupling metallization layer 24 to n-type silicon region 32.

Although the embodiment of the invention described in conjunction with FIGS. 1A and 1B was described with reference to an NPN transistor 16, the teachings of the invention are equally applicable to a PNP transistor. In such case, it will be clear to one of ordinary skill in the art that region 34 would be replaced with an n-type material, region 32 would be replaced with a p-type material, and region 28 would be replaced with an n-type material. Regions 18 and 20 would be replaced with p-type materials.

Figure 1C:
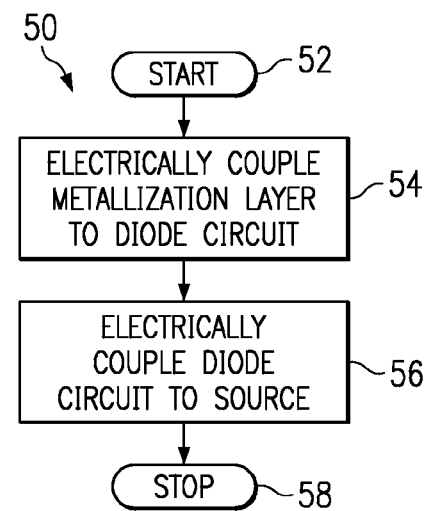
FIG. 1C is a flowchart illustrating example steps associated with a method for reducing charging damage in silicon on insulator technology according to the teachings of the invention.

FIG. 1C is a flowchart illustrating example steps associated with a method 50 for reducing charging damage in silicon-on-insulator devices, such as device 10 of FIG. 1A. Method 50 begins at a step 52. At a step 54 metallization layer 24 is electrically coupled to a diode circuit, such as diode circuit 96. This may be performed in a variety of manners. For example, a metal trace may be formed between metallization layer 24 and diode circuit 96, or, gate 22 may be directly coupled to diode circuit 96, for example. Because gate 32 is already electrically coupled to metallization layer 24, electrically coupling gate 22 to diode circuit 96 provides the electrical coupling between metallization layer 40 and diode 30. Other well-known techniques for forming a conductive path between two elements in a transistor may be used to perform this step. In addition, yet to be developed technologies may also be used.

At step 56, diode circuit 96 is electrically coupled to source region 18. According to one embodiment, this coupling may be made through a metal trace 38 or other conductive coupling between diode circuit 96 and source region 18. In other embodiments, the conductive coupling may occur through silicon, thereby forming a diode junction between source 18 and diode 30; however, such a diode junction leads to problems in other areas. Other well-known techniques for electrically coupling diode circuit 96 to source region 18 may be utilized to perform this step, including yet to be developed techniques. The method concludes at step 58.

In this embodiment, such a method allows any charge developed on metallization layer 24 to be dissipated into source region 18 and therefore reduces any potential differential across oxide layer 26. Such reduction inhibits arcing across gate oxide 26, which enhances the reliability of transistor 16. However, during use, diode 30 prevents flow from source region 18 to metallization layer 24, which is desired. In some biasing cases, diode 30 would not prevent such current flow. Embodiments addressing this situation are described below in conjunction with FIGS. 2 through 4.

Diode circuit 96 is designed to prevent, at least in part, leakage flow between metal layer 24 and source region 18 during normal operation and allow current flow, at least in part, during fabrication. In some embodiments, the diode circuit will prevent current flow during normal operation for all anticipated operating conditions; in other embodiments diode circuit will prevent current flow between metal layer 24 and source region 18 for only certain devices. Furthermore, in some embodiments, diode circuit will allow current flow in both directions between metal layer 24 and source region 18 during fabrication, while in other embodiments current flow is only prevented in one direction.

Figure 2A:
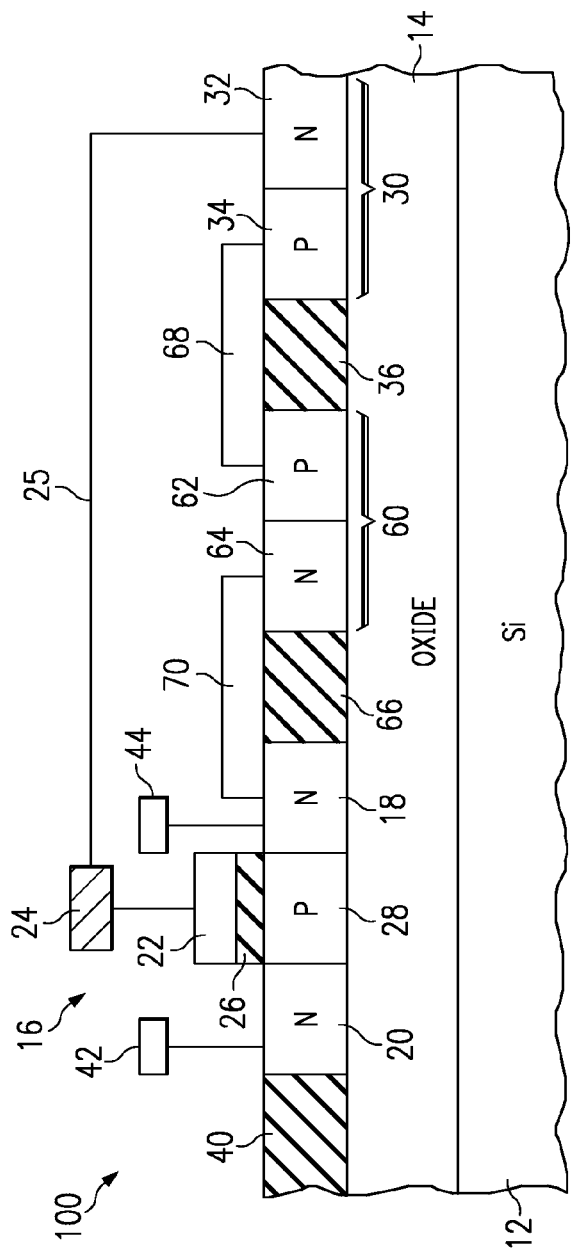
FIG. 2A is a partial cross-sectional and partial schematic diagram of portions of a semiconductor device according to another embodiment of the invention.

FIG. 2A is a partial cross-sectional and partial schematic diagram of portions of a semiconductor device according to another embodiment of the invention. Device 100 is substantially similar to device 10, described above in conjunction with FIGS. 1A and 1B. However, in this embodiment, an additional diode 60 is included in semiconductor device 10 to address problems that may occur with the embodiment of FIGS. 1A and 1B associated with current flowing from source region 18 to metallization layer 24. Such current may flow in response to certain biasing conditions that may be applied during operation. The associated circuit diagram is illustrated in FIG. 2B.

In this example, semiconductor device 100 includes diode 60 placed in a back-to-back configuration with diode 30. Diode 60 comprises a p-type silicon portion 62 and an n-type silicon portion 64. A region of oxide 66 isolates diode 60 from source region 18. A conductive connector 68 couples p-type region 34 of diode 30 to p-type region 62 of diode 60. A conductive connector 70 couples n-type region 64 of diode 60 to source region 18. Conductive connectors 68 and 70 may be formed in an analogous manner and comprise analogous material to that of connector 38, illustrated in FIG. 1A.

Figure 2B:
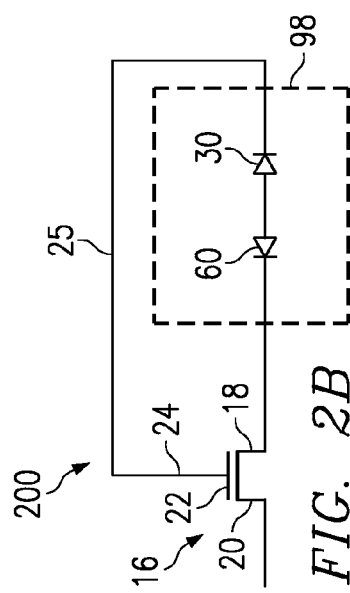
FIG. 2B is a circuit schematic representing the semiconductor device of FIG. 2A according to another embodiment of the invention.

According to the teachings of the invention, the embodiment of FIGS. 2A and 2B operates in a similar manner to semiconductor device 10; however, during normal operation, back-to-back diodes 30 and 60 prevent any flow from source region 18 to metallization layer 24 that may otherwise occur during certain biasing conditions. However, during fabrication, leakage current flows through both diodes 60 and 30 because the diodes are exposed to illumination during plasma etching and/or deposition. Exposing diodes to illumination allows significant leakage flow and thus allows any charge built up on metallization layer 24 to discharge into source region 18 and therefore prevent any arcing of charge through gate oxide layer 26 during fabrication.

FIG. 2B is a circuit schematic representing the semiconductor device of FIG. 2A according to another embodiment of the invention. As illustrated, semiconductor device 100 comprises a transistor having its gate 22 and associated metallization layer 24 coupled to its source 18 through a diode circuit 98. In this example, diode circuit 98 comprises back-to-back transistors 60 and 30. As described above, this configuration prevents any current flow through diode circuit 98 during normal operation, therefore preventing any flow from source region 18 to gate metallization layer 24 and gate 22. However, during fabrication, and particularly during the plasma etching and/or deposition steps, diodes 30 and 60 are exposed to illumination, thereby allowing current flow in both directions between gate metallization layers 24 and source 18. Such current flow prevents any potential difference from building up across gate oxide 26 (FIG. 2A) and thereby reduces the likelihood of any current arcing across oxide and increases the reliability of semiconductor device 100.

Figure 3A:
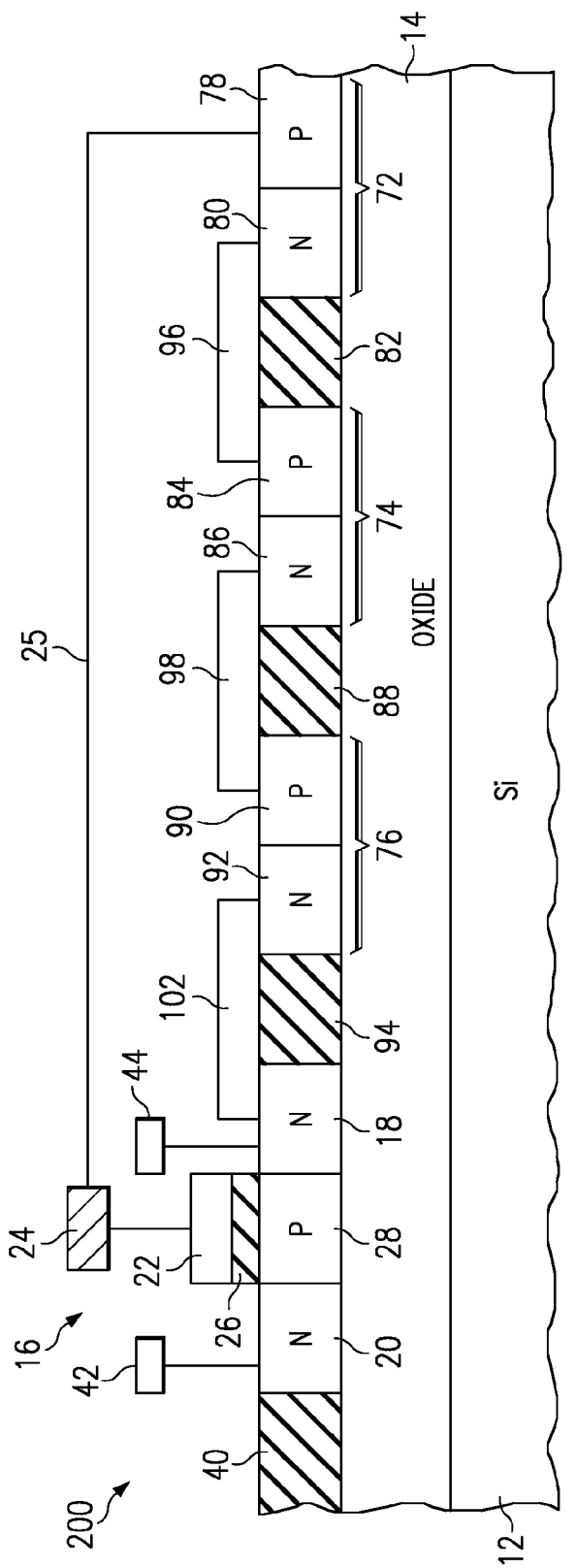
FIG. 3A is a partial cross-sectional and partial schematic diagram of portions of a semiconductor device according to yet another embodiment of the invention.
Figure 3B:
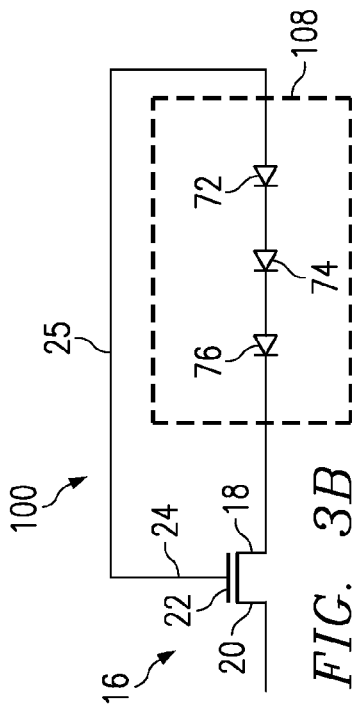
FIG. 3B is a circuit schematic representing the semiconductor device of FIG. 3A according to yet another embodiment of the invention.

FIG. 3A is a partial cross-sectional and partial schematic diagram of portions of a semiconductor device 200 according to yet another embodiment of the invention. In this embodiment, three diodes are placed in the conductive path from metallization layer 24 to source region 18. These diodes comprise diode 72, diode 74, and diode 76. These diodes are oriented in a forward bias mode. Diode 72 comprises a p-type region 78 and an n-type region 80. Diode 74 comprises a p-type region 84 and an n-type region 86. Diode 76 comprises a p-type region 90 and an n-type region 92. The diodes are separated from each other by oxide regions 82 and 88. An oxide region 94 isolates source region 18 from diode 76. A conductive connector 96 couples n-type region 80 of diode 72 to p-type region 84 of diode 74. A conductive connector 98 couples n-type region 86 of diode 74 to p-type region 90 of diode 76. A conductive connector 102 couples n-type region 92 of diode 76 to source region 18. A circuit diagram of this embodiment is illustrated in FIG. 3B. Conductive connectors 96, 98, and 102 are analogous to conductive connectors 38 of FIG. 1A and conductive connectors 68 and 70 of FIG. 2A and may be formed in a similar manner.

According to the teachings of the invention, during normal operation, diodes 72, 74, and 76, forming diode circuit 108 prevent current flow from metal layer 24 to source region 18 because the voltage differential required to turn on region diode circuit 108 is approximately 2.1 volts (0.7 volts per diode). Therefore, during normal operation the current may not flow between metal layer 24 and source region 18, because the normal bias voltage between the gate and the source does not exceed this amount. However, during fabrication, and particularly during plasma etching or deposition, diode circuit 100 allows current flow in both directions because of the illumination of the diodes. This allows current buildup in layer 24 during fabrication to flow to source region 18 through diode circuit 108, thereby minimizing any potential difference between metal layer 24 and source region 18. This reduces the likelihood of arcing across gate oxide 26 and damage to that region.

Although this embodiment was described using three diodes for clarity of illustration purposes, any combination of diodes that result in the total bias voltage required to turn on the diodes may be used. In many conventional applications, a 1.5 voltage level may typically occur between gate 22 and source region 18, and therefore three diodes are appropriate in this example. However, in other applications utilizing different source voltages, the number of diodes may be adjusted appropriately.

Although the present invention and its advantages have been described in detail, it should be understood that various changes, substitutions, and alterations can be made therein without departing from the spirit and scope of the present invention as defined by the appended claims.

What is claimed is:

1. A method for reducing charge damage in a silicon-on-insulator device during fabrication, comprising:
   providing an oxide layer over a substrate;
   providing a field effect transistor structure over the oxide layer; the transistor structure including source and drain regions of a first conductivity type separated by a body region of a second conductivity type, a gate oxide over the body region, and a gate over the gate oxide;
   providing a diode over the oxide layer, spaced by an oxide region from the source region of the transistor structure; the diode comprising a material of the first conductivity type and a material of the second conductivity type disposed in a p-n junction configuration;
   providing a metallization layer to form a conductive contact to the gate; and
   conductively coupling the metallization layer through the diode to the source region to enable charge built up on the metallization layer to discharge to the source region and to the body region under the gate oxide, thereby reducing potential difference across the gate oxide during fabrication of the device wherein an electrical interconnection layer is formed above and in contact with the oxide region and at least a portion of each of the source region and the diode.

2. The method of claim 1, wherein the diode comprises a single diode oriented with respect to the gate and the source region to present a reverse biased p-n junction to prevent current flow from the gate to the source region during operation of the transistor.

3. The method of claim 2, wherein the source region is an n-type source region coupled by a metal trace to p-type material of the diode; and the metallization layer is coupled by a metal trace to n-type material of the diode.

4. The method of claim 1, wherein the metallization layer forming the conductive contact to the gate is a gate metallization layer; and further comprising forming a source metallization layer forming a conductive contact to the source region and a drain metallization layer forming a conductive contact to the drain region, the conductive coupling of the gate metallization layer to the source region through the diode enabling the reduction of differential charging between the gate metallization layer and the source and drain metallization layers which might otherwise cause current to flow through the gate oxide.

5. The method of claim 1, wherein the transistor structure and diode are relatively disposed with the source region of the first conductivity type proximate to and spaced from the diode material of the second conductivity type by the oxide region.

6. The method of claim 5, wherein the first conductivity type is n-type and the second conductivity type is p-type.

7. The method of claim 5, wherein the source region and the diode material of the second conductivity type are connected through a conductive connection comprising a metal trace.

8. A method for reducing charge damage in a silicon-on-insulator device during fabrication, comprising:
   providing an oxide layer over a substrate;
   providing a field effect transistor structure over the oxide layer; the transistor structure including source and drain regions of a first conductivity type separated by a body region of a second conductivity type, a gate oxide over the body region, and a gate over the gate oxide;
   providing at least one diode over the oxide layer, spaced by an oxide region from the source region of the transistor structure; the at least one diode comprising a material of the first conductivity type and a material of the second conductivity type disposed in a p-n junction configuration;
   providing a metallization layer to form a conductive contact to the gate; and
   conductively coupling the metallization layer through the at least one diode to the source region to enable charge built up on the metallization layer to discharge to the source region and to the body region under the gate oxide, thereby reducing potential difference across the gate oxide;
   the at least one diode being dimensioned, configured and adapted to enable leakage current to flow between the metallization layer and the source region through the at least one diode under illumination by plasma during fabrication, but to prevent current flow between the metallization layer and the source region through the at least one diode in operation of the fabricated device wherein an electrical interconnection layer is formed above and in contact with the oxide region and at least a portion of each of the source region and the at least one diode.

9. The method of claim 8, wherein the at least one diode comprises a pair of back-to-back diodes; and conductively coupling the metallization layer through the at least one diode to the source region comprises coupling the metallization layer through the pair of back-to-back diodes.

10. The method of claim 8, wherein the at least one diode comprises at least three diodes connected in series; and conductively coupling the metallization layer through the at least one diode to the source region comprises coupling the metallization layer through the at least three diodes connected in series.

11. The method of claim 8, wherein the electrical interconnection layer is a metal trace.

12. A method for reducing charge damage in a silicon-on-insulator device during fabrication, comprising:
   providing an oxide layer over a substrate;
   providing a field effect transistor structure over the oxide layer; the transistor structure including source and drain regions formed of silicon doped with an n-type material separated by a body region formed from silicon doped with a p-type material, a gate oxide over the body region, and a gate including one or more layers of conductive material over the gate oxide;
   providing a diode over the oxide layer, spaced by an oxide region from the source region of the transistor structure; the diode comprising an n-type material and a p-type material disposed in a p-n junction configuration;
   providing a metallization layer to form a conductive contact to the gate; and
   conductively coupling the metallization layer through the diode to the source region to enable charge built up on the metallization layer to discharge to the source region as leakage current under illumination of the diode by a plasma, and to present a reverse-biased p-n junction to prevent flow of current from the source region to the metallization layer during operation of the transistor in the fabricated device wherein an electrical interconnection layer is formed above and in contact with the oxide region and at least a portion of each of the source region and the diode.

13. The method of claim 12, wherein the diode is a single diode; and the source region is conductively coupled to the diode p-type material by a metal trace.

* * * * *